United States Patent
Hu

(10) Patent No.: US 9,638,731 B2
(45) Date of Patent: May 2, 2017

(54) CAPACITIVE TOUCH KEYBOARD

(71) Applicant: Touchplus Information Corp., New Taipei (TW)

(72) Inventor: Shih Hsien Hu, New Taipei (TW)

(73) Assignee: Touchplus Information Corp., New Taipei (TW)

( * ) Notice: Subject to any disclaimer, the term of this patent is extended or adjusted under 35 U.S.C. 154(b) by 780 days.

(21) Appl. No.: 13/829,460

(22) Filed: Mar. 14, 2013

(65) Prior Publication Data

US 2014/0097857 A1     Apr. 10, 2014

Related U.S. Application Data

(63) Continuation-in-part of application No. 13/724,745, filed on Dec. 21, 2012.

(30) Foreign Application Priority Data

Oct. 5, 2012  (TW) .................... 101136948

(51) Int. Cl.
| | |
|---|---|
| G01R 27/26 | (2006.01) |
| G06F 3/044 | (2006.01) |
| H03K 17/96 | (2006.01) |
| H03K 17/98 | (2006.01) |
| G06F 3/02 | (2006.01) |

(52) U.S. Cl.
CPC ....... *G01R 27/2605* (2013.01); *G06F 3/0202* (2013.01); *G06F 3/044* (2013.01); *H03K 17/9622* (2013.01); *H03K 17/98* (2013.01); *H03K 2017/9602* (2013.01)

(58) Field of Classification Search
None
See application file for complete search history.

(56) References Cited

U.S. PATENT DOCUMENTS

| | | | | |
|---|---|---|---|---|
| 4,550,221 A | * | 10/1985 | Mabusth | G06F 3/03547 178/18.06 |
| 7,030,860 B1 | * | 4/2006 | Hsu | G06F 3/044 178/18.06 |
| 7,804,307 B1 | * | 9/2010 | Bokma | G01R 27/2605 324/607 |

(Continued)

FOREIGN PATENT DOCUMENTS

| | | |
|---|---|---|
| CN | 1823320 A | 8/2006 |
| CN | 101587405 A | 11/2009 |

(Continued)

*Primary Examiner* — Patrick Assouad
*Assistant Examiner* — Suresh K Rajaputra
(74) *Attorney, Agent, or Firm* — Muncy, Geissler, Olds & Lowe, P.C.

(57) ABSTRACT

A capacitive touch keyboard includes a shielding layer, a intermediate layer, and a one-dimensional sensor layer where the soft intermediate layer is interposed between the other two to form a capacitor structure. The shielding layer includes a ground plane, and plural first key areas at its outer surface. The one-dimensional sensor layer includes plural sensing cells and plural second key areas where the first key areas correspond to the second key areas, and respective cells are electrically connected to a sensing circuit. Therefore, features of more compact size, simplified structure design, and tactile feel are provided in a capacitive keyboard.

20 Claims, 11 Drawing Sheets

(56) References Cited

U.S. PATENT DOCUMENTS

| | | | | |
|---|---|---|---|---|
| 8,040,142 B1* | 10/2011 | Bokma | ............... | H03K 17/955 324/658 |
| 8,223,130 B2* | 7/2012 | Takashima et al. | ........... | 345/173 |
| 8,415,959 B2* | 4/2013 | Badaye | ................... | G06F 3/044 324/658 |
| 8,860,683 B2* | 10/2014 | Baumbach | .......... | G06F 3/03547 345/174 |
| 8,878,811 B1* | 11/2014 | Baumbach | .......... | G06F 3/03547 345/174 |
| 8,912,930 B2* | 12/2014 | Hu | ....................... | G06F 3/0202 178/18.01 |
| 8,947,366 B2* | 2/2015 | Chien | .................... | G06F 3/044 178/18.01 |
| 2005/0257628 A1* | 11/2005 | Nikaido | ................ | B60N 2/002 73/862.541 |
| 2006/0278444 A1* | 12/2006 | Binstead | ................ | G06F 3/044 178/18.06 |
| 2007/0262962 A1* | 11/2007 | XiaoPing | ................. | G06F 1/32 345/173 |
| 2007/0273560 A1* | 11/2007 | Hua | ....................... | G06F 3/0202 341/33 |
| 2009/0135150 A1* | 5/2009 | Takashima | .............. | G06F 3/041 345/173 |
| 2010/0120005 A1* | 5/2010 | Abouelsaadat | ...... | A47G 33/008 434/245 |
| 2011/0080368 A1* | 4/2011 | Lee | ......................... | G06F 3/045 345/174 |
| 2011/0095919 A1 | 4/2011 | Ostermoeller et al. | | |
| 2011/0216018 A1* | 9/2011 | Kim | ....................... | G06F 3/041 345/173 |
| 2012/0098788 A1 | 4/2012 | Sekiguchi | | |
| 2012/0235953 A1 | 9/2012 | Kim et al. | | |

FOREIGN PATENT DOCUMENTS

| | | |
|---|---|---|
| CN | 201548942 U | 8/2010 |
| CN | 102455835 A | 5/2012 |
| CN | 202443456 U | 9/2012 |
| CN | 102707831 A | 10/2012 |
| TW | 102289288 A | 12/2011 |
| TW | M417612 U | 12/2011 |

* cited by examiner

CAPACITIVE TOUCH KEYBOARD

CROSS-REFERENCE TO RELATED APPLICATIONS

The present application is a continuation-in-part application claiming benefit from a parent U.S. Patent Application bearing a Ser. No. 13/724,745 and filed on Dec. 21, 2012, contents of which are incorporated herein for reference.

FIELD OF THE INVENTION

The invention is relevant to a keyboard device, especially to a capacitive touch keyboard with pressure detection and plural responsive functions.

DESCRIPTION OF THE PRIOR ART

Presently, most known keyboard device can be categorized into two types, contact type and contactless type. The first one is mostly referred to mechanical keyboard and membrane keyboard, in which current flows through contact points to provide pressing signals to a control circuit as input in response to depressing of a finger on a keyboard key. A circuit model for such conventional keyboard is shown in FIG. 1 as a 5×8 keyboard matrix. A short circuit is formed upon depressing action of user's finger on a keycap such that the depressed key can be detected.

As to the second one, contactless type keyboard, a representative product is capacitive keyboard, including mechanical type, touch button type, and virtual keyboard. A mechanical capacitive keyboard is shown in FIG. 2, in which when a user depresses a keycap 911, a top plate 912 is pushed toward a PCB 913 laid on bottom so that a capacitance between two plates 912 and 913 is changed and then detected for achieving input purpose.

Referring to FIG. 3, an illustration of a conventional touch button type capacitive keyboard; in the keyboard, alternating current normally flows through a circuit. When a user depresses a key 921 with his finger, the capacitance of the keyboard is changed and is detected by a sensing controller 922 as a key input.

Nowadays, projective capacitive touch technology has been widely used in various consumer products such as mobile phones, tablets, or the like, in which a virtual type keyboard is utilized. The virtual keyboard is capable of identifying location (in coordinate sense) of a finger on a screen as key input, employs the same concept of identifying capacitance change while the finger is touching on a key as the capacitive keyboard above. FIGS. 4A and 4B show two kinds of capacitance sensing structure as one component of a virtual keyboard, one for double side bar type and the other for single side diamond type with bridge, and both of which are referred to two dimensional matrix electrode arrangement.

To sum up, conventional contact keyboard has drawbacks of poor reliability due to contact points and susceptibility to contamination while contactless keyboard is either expensive or lacking in tactile feel for depressing.

SUMMARY OF THE INVENTION

One objective of the present invention is to improve drawbacks of high cost and a lack of tactile feel for depressing in conventional capacitive keyboard.

Another objective of the present invention is to provide a capacitive touch keyboard not only offering tactile feel and gesture operation but also reducing device size and cost due to adoption of one-dimensional single layer capacitance sensing structure.

To achieve the objectives above and others, a capacitive touch keyboard of the invention comprises a shielding layer, an intermediate layer, and a one-dimensional sensor layer, wherein the one-dimensional sensor layer is electrically connected to a sensing circuit through such as a flexible printed circuit (FPC).

The shielding layer includes a ground plane. The shielding layer also includes plural first key areas at its outer surface. The intermediate layer is interposed between the ground plane of the shielding layer and the one-dimensional sensor layer, thereby forming a capacitor structure.

The one-dimensional sensor layer includes plural sensing cells which correspond to plural second key areas defined at the outer surface of the sensor layer, wherein respective sensing cells are electrically connected to the sensing circuit. Plural sensing cells correspond to the plural second key areas and the plural first key areas.

The shielding layer, the intermediate layer and the one-dimensional sensor layer are configured to have a clearance between shielding layer and the one-dimensional sensor layer changeable in response to a pressing operation of a user on the plural first key areas or the plural second key areas.

Through the keyboard design of the present invention, simplified structure is involved and a user is provided with clear tactile feel as downward deflection when depressing the shielding layer or the sensor layer with his finger, and at the same time a clearance between the ground plane of the shielding layer and the sensing cells of the one-dimensional sensor layer is also shortened so that a change on the capacitance of the keyboard is generated allowing the sensing circuit to recognize the depressed key.

In addition, the present keyboard has advantages that users can depress either side (top or bottom side) of the keyboard to trigger a specific key and perform a gesture operation on the sensor layer.

Preferably, the shielding layer may further comprise a dielectric material covering on the ground plane which may be referred to a polymethylmethacrylate (PMMA), polyester (PET) film, or rubber. The ground plane may be formed of a plate sheet or alternatively, it may comprise plural hexagonal ground plane cells, and adjacent ground plane cells are electrically connected with each other.

The intermediate layer may be formed to be a single plate type with or without any through holes. In the case of a plate with through holes as intermediate layer, the first and the second key areas are configured to correspond to the plural through holes.

Each of the sensing cells may be surrounded by six other cells, for example, each cell is formed to be a hexagon, so as to form a honeycomb pattern altogether.

The one-dimensional sensor layer may be connected to the sensing circuit through an FPC. Furthermore, the ground plane may be configured to generate a stimulus voltage from the sensing circuit, providing an extremely sensitive proximate sensing.

The prevent invention also provides a capacitive touch keyboard comprising a shielding layer, a one-dimensional sensor layer, an intermediate layer, and a sensing circuit where the shielding layer comprises a grounding conductive structure, the one-dimensional sensor layer comprises a plurality of sensing cells and has at least one key area on an outer surface of the one-dimensional sensor layer.

The intermediate layer is interposed between the shielding layer and the one-dimensional sensor layer so as to form a plurality of capacitor members, and has a through hole thereon corresponding to the key area, wherein the one-dimensional sensor layer deforms by way of a space of the through hole in response to a pressing operation on the key area, thereby changing a clearance between one of the sensing cells and the grounding conductive structure.

The sensing circuit is electrically connected to the plurality of sensing cells for sensing both an electronic parameter change correlating to the clearance between one of the sensing cells and the grounding conductive structure, and a capacitance change resulting from a finger touch on the one-dimensional sensor layer.

The electronic parameter change includes a capacitance change or a voltage change when the clearance between one of the sensing cells and the grounding conductive structure is substantially zero as the sensing cells and the grounding conductive structure contact each other.

BRIEF DESCRIPTION OF THE DRAWINGS

The primitive objectives and advantages of the present invention will become apparent upon reading the following description and upon reference to the accompanying drawings in which.

DESCRIPTION OF THE PREFERRED EMBODIMENT

The present invention provides a capacitive touch keyboard featuring that whole structure is quite simplified, tactile feel is provided upon depressing action, and keyboard size is reduced.

In order to fully understand the manner in which the above-recited details and other advantages and objects according to the invention are obtained, a more detailed description of the invention will be rendered by reference to the best-contemplated mode and specific embodiments thereof. The following description of the invention is made for the purpose of illustrating the general principles of the invention and should not be taken in a limiting sense; it is intended to illustrate various embodiments of the invention. As such, the specific modifications discussed are not to be construed as limitations on the scope of the invention. It will be apparent to one skilled in the art that various equivalents, changes, and modifications may be made without departing from the scope of the invention, and it is understood that such equivalent embodiments are to be included herein. The terminology used in the description presented below is intended to be interpreted in its broadest reasonable manner, even though it is being used in conjunction with a detailed description of certain specific embodiments of the invention. Certain terms may even be emphasized below; however, any terminology intended to be interpreted in any restricted manner will be overtly and specifically defined as such in this detailed description section. Where the context permits, singular or plural terms may also include the plural or singular term, respectively. Moreover, unless the word "or" is expressly limited to mean only a single item exclusive from the other items in a list of two or more items, then the use of "or" in such a list is to be interpreted as including (a) any single item in the list, (b) all of the items in the list, or (c) any combination of items in the list. Preferred embodiments and aspects of the invention will be described to explain the scope, structures and procedures of the invention. In addition to the preferred embodiments of the specification, the present invention can be widely applied in other embodiments.

Figure 1:
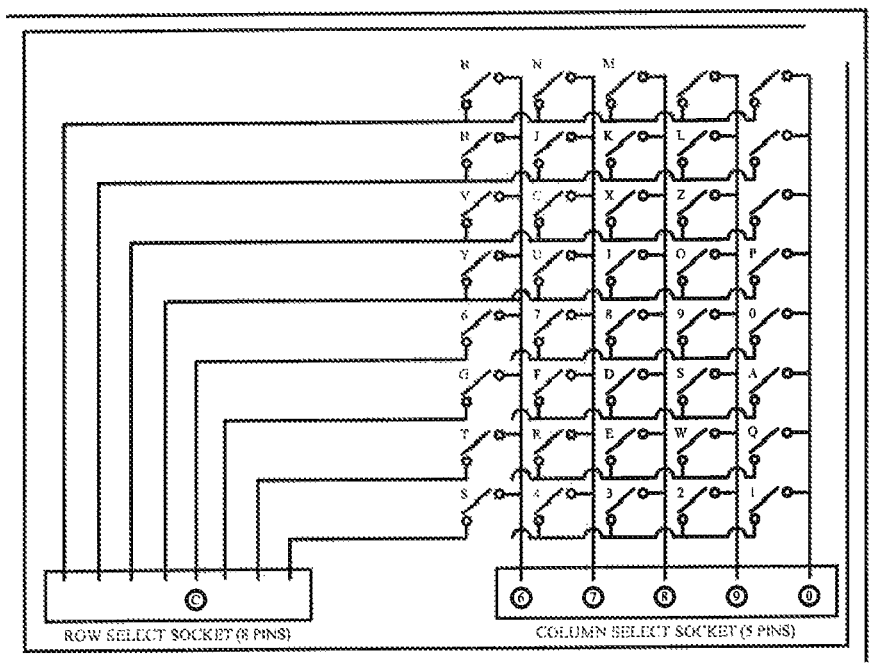
FIG. 1 is a circuit diagram of a conventional contact type keyboard.
Figure 2:
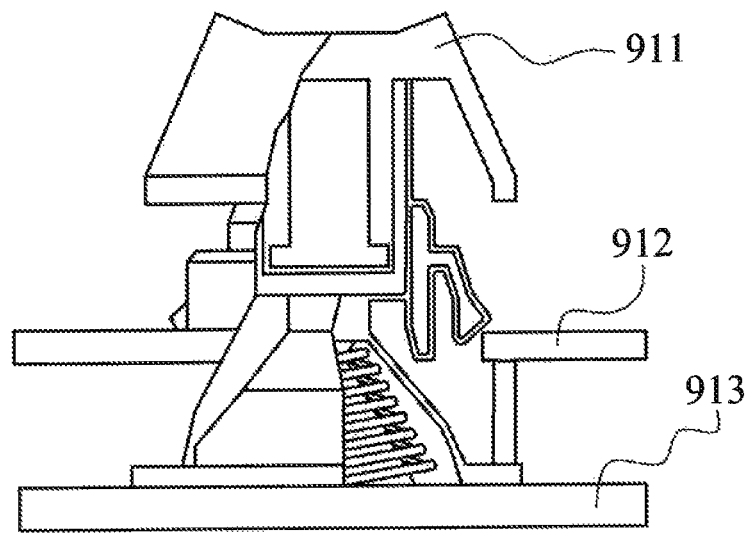
FIG. 2 is an illustration of a conventional mechanical capacitive keyboard.
Figure 3:
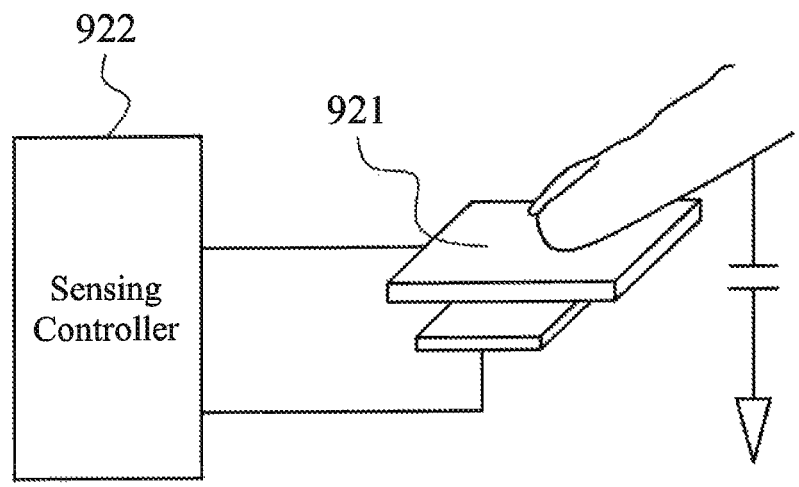
FIG. 3 is an illustration of a conventional touch button type capacitive keyboard.
Figure 4A:
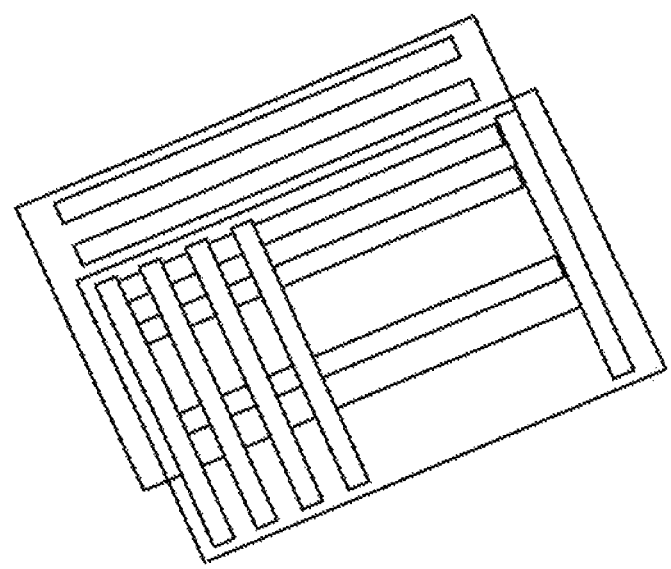
FIGS. 4A and 4B show illustrations of two conventional two dimensional capacitance sensing structure.
Figure 4B:
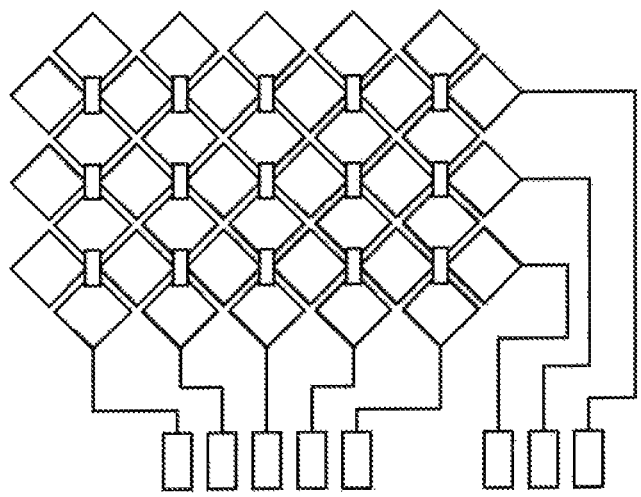
Figure 5:
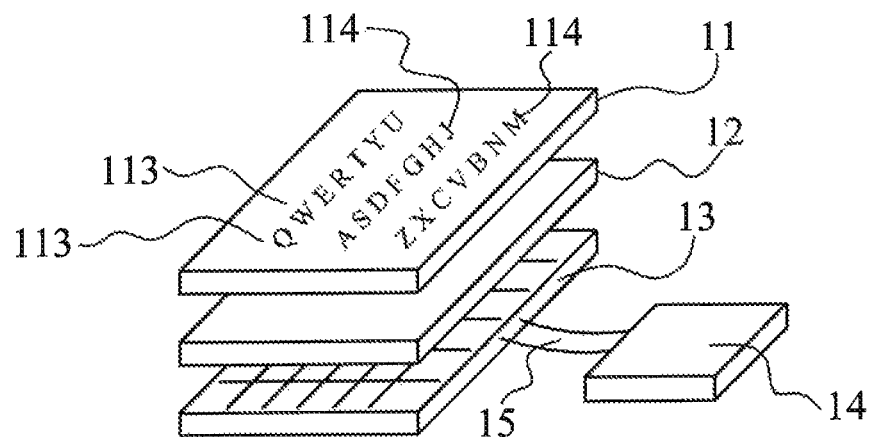
FIG. 5 is an illustration of a capacitive touch keyboard according to a first embodiment of the present invention.

Referring to FIG. 5, an illustration of a capacitive touch keyboard according to a first embodiment of the present invention; this example shows that a touch keyboard mainly includes a soft shielding layer 11, a soft intermediate layer 12, and a one-dimensional sensor layer 13, stacked in the order from the top down.

The soft shielding layer 11 includes a conductive ground plane 111 and a dielectric material 112 covering on the ground plane 111. The soft shielding layer 11 has, at its outer surface, several key areas 113 representative of pre-set positions for input keys of the keyboard device, as 21 areas (matrix of 3 rows and 7 columns) shown in FIG. 5. The shielding layer 11 is made to deform temporarily when a user exerts a depressing force on it and return to its natural state when the force is released. Material selected for the ground plane 111 may be metal, e.g. copper, and the dielectric material 112 may be PMMA, PET film, or rubber. Plural key labels 114 are imprinted on the dielectric material 112 corresponding to different key areas 113 such as English letters shown in the figure and they provide the same identification as those letters in a traditional keyboard. These key labels 114 are certainly externally visible to provide visual identification for users.

Figure 7:
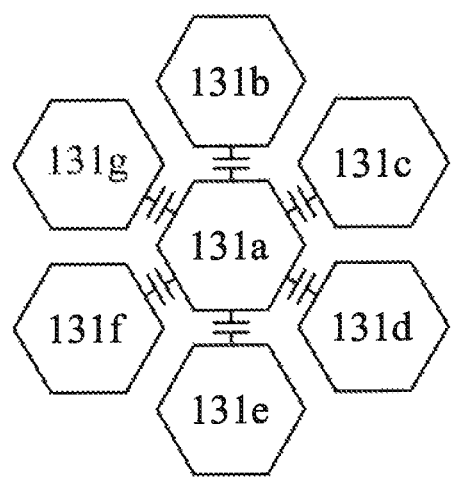
FIG. 7 is an illusion of a portion of sensing cells in a one-dimensional sensor layer in FIG. 5.

The one-dimensional sensor layer 13 is a single layer printed circuit board (PCB). In case of including component routing, PCB itself is normally 2-layered. The phrase "single layer" is used hereinafter particularly to differentiate from two indium tin oxide (ITO) plates (as a row electrode and a column electrode respectively) employed in conventional sensor layers. In the embodiment the one-dimensional sensor layer 13 includes plural hexagonal sensing cells, some of which are shown in FIG. 7 numbered as 131a through 131g, and all cells exhibit a honeycomb pattern. Each sensing cell is aligned with corresponding key area 113 of the soft shielding layer 11 and is electrically connected to a capacitance sensing circuit 14 through a conducting line where all conducting lines may be integrated in an FPC 15.

The ground plane of the shielding layer may be made of such as copper, silver paste. ITO, antimony doped tin oxide (ATO), indium zinc oxide (IZO), zinc oxide (ZnO) or the like, as well as combination of those mentioned above.

The soft intermediate layer 12 is interposed between the ground plane 111 of the soft shielding layer 11 and the one-dimensional sensor layer 13, serving as a separation material of the two so that a capacitor structure of ground plane/intermediate layer/sensing cell is constituted. In the example, material selected for the soft intermediate layer 12 is optical clear resin (OCR) or optical clear adhesive (OCA) for an advantage that uniform distance between two plates of the capacitor structure is provided, allowing similar characteristics of the keyboard all over the device. Further, the soft intermediate layer 12 also serves as sponge buffer increasing tactile feel while the user is repressing the key.

Figure 6A:
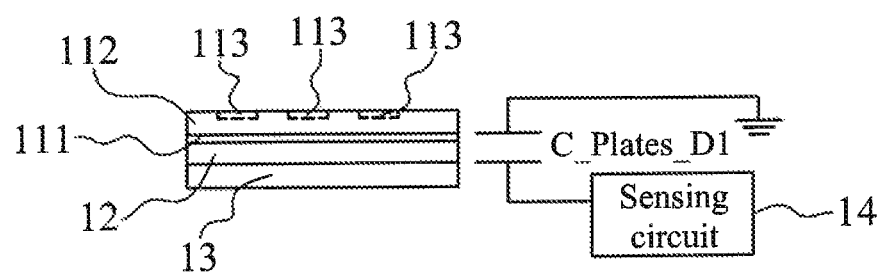
FIG. 6A is an illustration of cross-sectional view accompanying with related simplified capacitance circuit of the keyboard in FIG. 5 when the keyboard is not operated yet.
Figure 6B:
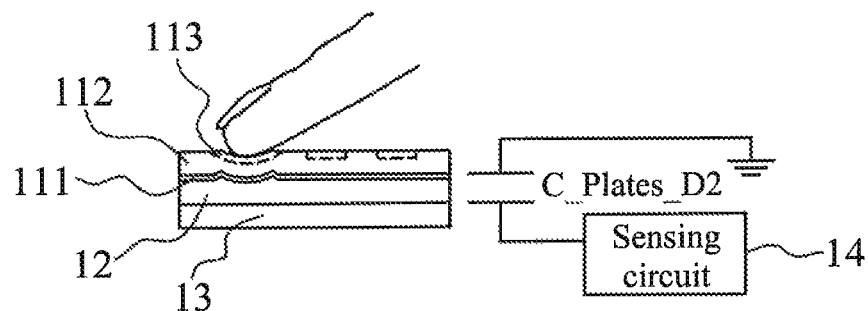
FIG. 6B is an illustration of cross-sectional view accompanying with related simplified capacitance circuit of the keyboard in FIG. 5 when a depression action is operated on it.

Referring to FIGS. 6A and 6B, an illustration of cross-sectional view accompanying with related simplified capacitance circuit of the keyboard in FIG. 5 when the keyboard is not operated yet and when a depression action is operated on the keyboard; when the keyboard device is not operated yet, the ground plane 111 and the one-dimensional sensor layer 13 define a clearance of D1 and a capacitance signal probed in the sensing circuit 14 is denoted by C_plates_D1 as shown in FIG. 6A. When a user depresses with his finger on an key area 113 of the soft shielding layer 11, the clearance between the ground plane 111 and the one-dimensional sensor layer 13 is changed from D1 to D2 (D2 is smaller than D1) due to deformation occurs in the two layers 11 and 12 as shown in FIG. 6B, and the sensing circuit 14 probes a capacitance C_plates_D2.

Therefore, through the novel structure above, capacitive keyboard device offers a depressing tactile feel and better operation confirmation to users and drawbacks in contact type keyboard are also avoided.

Figure 8:
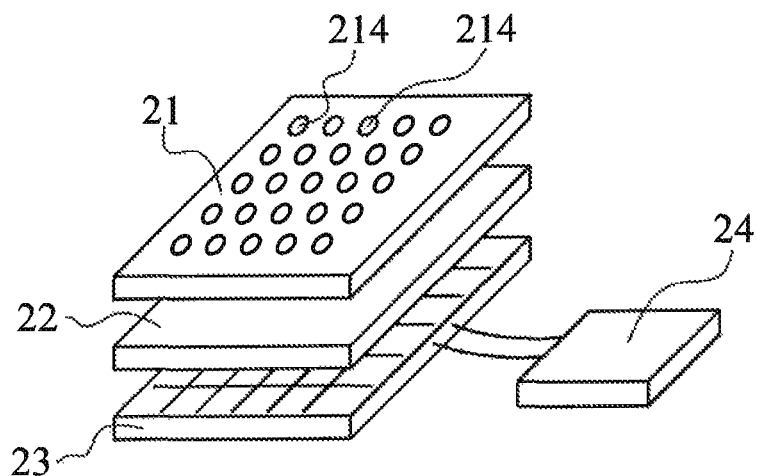
FIG. 8 is an illustration of a capacitive touch keyboard according to a second embodiment of the present invention.
Figure 9:
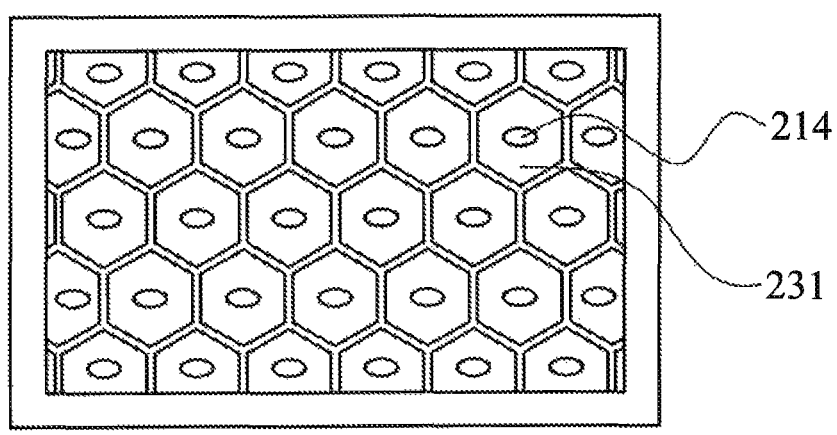
FIG. 9 is an illustration of arrangement for sensing cells and openings in FIG. 8.

Referring to FIG. 8, an illustration of a capacitive touch keyboard according to a second embodiment of the present invention, and to FIG. 9, an illustration of arrangement for sensing cells and openings in FIG. 8; the embodiment shares the same components as those in the first embodiment such as a soft shielding layer 21, a soft intermediate layer 22 and a one-dimensional sensor layer 23, and related features are omitted here for simplicity. The difference from the first embodiment is that plural openings 214 are provided in the soft shielding layer 21 and each opening 214 extends through the ground plane 211 and the dielectric material 212 so that the intermediate layer 22 is exposed. The openings 214 correspond to sensing cells 231 of the sensor layer 23, and each opening 214 lies within profile of the corresponding sensing cell 231 as clearly shown in FIG. 9, a transparent top view.

Figure 10:
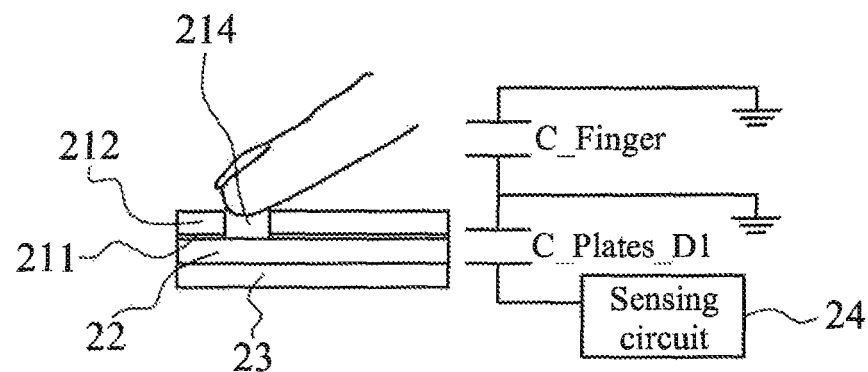
FIG. 10 is an illustration of cross-sectional view accompanying with related simplified capacitance circuit of the keyboard in FIG. 8 when a finger stays on one of the openings.

Since the ground plane disappears at where the openings is located, when a user gently touches (without "depressing") with his finger on that location, a finger capacitance is thus produced and denoted by C_Finger as shown in FIG. 10 and that a sensing circuit 24 probes a capacitance signal including C_Plates_D1 and C_Finger. Consequently, the sensing circuit is able to identify location of the finger and to track its movement, that is to say the openings 214 offer a gesture operation function, provided that definition is pre-set in related control circuit.

The honeycomb pattern formed by sensing cells is especially useful in the keyboard device with gesture operation function in that not only the sensing cells can be arranged in more compact form without wasting occupied area, but the maximum number of stimulus and sensing combination (63 for single cell, and more for cell grouping) (and thus better signal resolution) is provided. The sensor layer specifically comprises a substrate which may be PCB, the film or the glass sheet; sensor cells, which may be transparent, fabricated on the substrate. The sensor cells are formed with hexagon shapes and the pattern of the entire sensor cells is arranged to have the honeycomb configuration. As shown in the figure, the pluralities of the individual hexagons are arranged with seven hexagons to form a unit. One hexagon is surrounded by six adjacent hexagons. The center sensor cell may indicate one output signal when it is touched, and the center sensor cell with one of the adjacent sensor cells may indicate another output signal when the two sensor cells are touched. By the same reason, the combination of three, four and more sensor cells may be used to indicate certain output signal. Therefore, the unit of the sensor configuration may provide multiple output signals to indicate different instructions. The sensor cells are electrically connected to the control circuits. Thus, the touch panel of the invention can further locate the position of the finger more precisely Therefore, although the sensor cell of the invention may be much larger than the sensor cell of the traditional touch panel, however, the touch panel of the invention can locate the position of the finger precisely and the unit of the present invention may output multiple signals.

Figure 11:
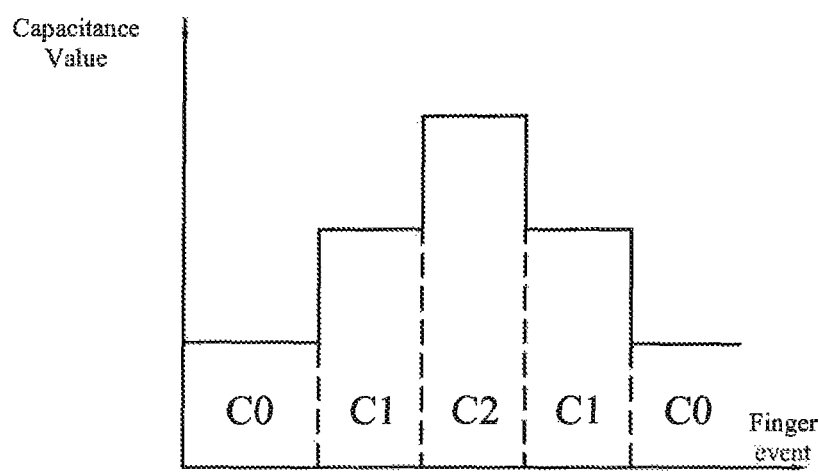
FIG. 11 is a graphic chart of capacitance result for various finger events with respect to the keyboard.

FIG. 11 shows capacitance variation in response to various finger event on the keyboard key. For example, when the finger is far away from the keyboard, the capacitance probed in the circuit is C0, when the finger gently touches the key area (stays on it without exerting a depressing force) or remains on the key area just after releasing the depressing, the capacitance probed in the circuit is C1, and when the finger exerts a force to depress the keyboard key, the capacitance probed in the circuit is C2. The capacitances above have a relation as follows: C2>C1>C0. Given the above, the openings allow the keyboard of the present invention not only to perform its intended input function as ordinary one, but to add a gesture operation function.

Figure 12:
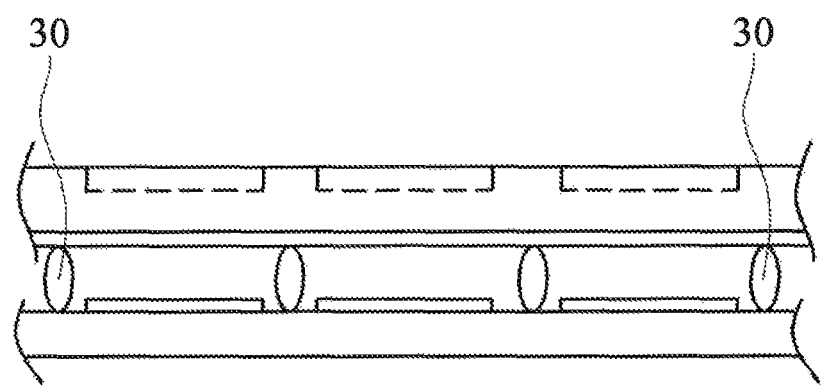
FIG. 12 is a capacitive touch keyboard according to a third embodiment of the present invention.

Referring to FIG. 12, a third embodiment of the present invention; the example is similar to the first one except for that the OCR or OCA plate serving as an intermediate layer is replaced with plural spacers 30. This kind of configuration provides a capacitor structure as well.

Figure 13:
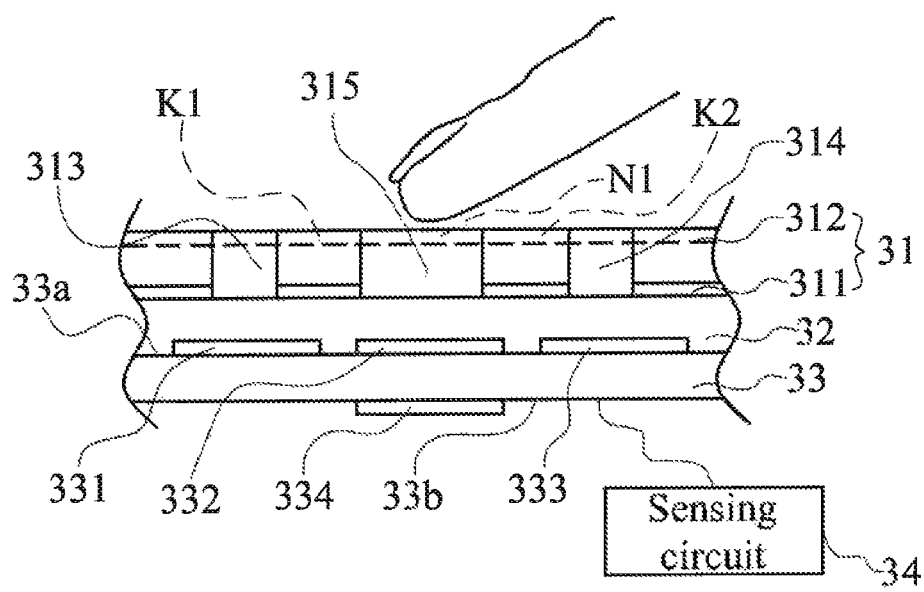
FIG. 13 is a capacitive touch keyboard according to a fourth embodiment of the present invention.

Referring to FIG. 13, a fourth embodiment of the present invention; in practical, to increase the signal stability, a ground plane is preferred disposed at the back side of a PCB, which will be illustrated in this example. A capacitive touch keyboard comprises a soft shielding layer 31 comprising a first ground plane 311 and a dielectric material 312 covering on the first ground plane 311, a one-dimensional sensor layer 33, and a soft intermediate layer 32 between the former two. The soft shielding layer 31 also includes plural key areas such as K1 and K2 at the outer surface, and openings 313 and 314 corresponding to the key areas K1 and K2. Between the key areas K1 and K2 there exists a non-key area N1, and it is implemented by a between-keys space 315 (as an opening) provided in the soft shielding layer 31.

The one-dimensional sensor layer 33 includes plural sensing cells 331 to 333 where the first sensing cells 331 and 333 correspond to the key areas K1 and K2 while the second sensing cell 332 to the non-key area N1. Respective cells are electrically connected to a capacitance sensing circuit 34. Operation for the key areas K1 and K2 is the same as that in the second embodiment and thus omitted here. When a finger approaches the area N1, a finger capacitance is produced, based on the same principle as for the openings 313 and 314. By offering plural between-keys spaces, a user is allowed to perform a gesture operation and therefore a touch keyboard has an added value. In this case, in order to give the same feeling of key operating as conventional keyboard, it is better to mount a key cap in each key area while adjacent key caps are separated by a clearance.

For improved signal stability, the non-key area N1, a two-layered PCB (serving as the one-dimensional sensor layer 33) has a second ground plane 334 on a back side 33$b$ opposite to a front side 33$a$ which the cells 331 to 333 are disposed on, and in the example the second ground plane 334 corresponds to the cell 332 only. In addition, by providing a stimulus voltage to first or second ground plane 334 (for example, from the sensing circuit 34) and the first or second ground plane 334 further emitting the stimulus out for coupling with any approaching object such as a finger, thereby an extremely sensitive proximate sensing can be achieved. It is noted that in this embodiment, plural non-key areas (and also between-keys spaces) and second ground planes are involved though only one for each is shown in the figure (some are overlapping).

Figure 14:
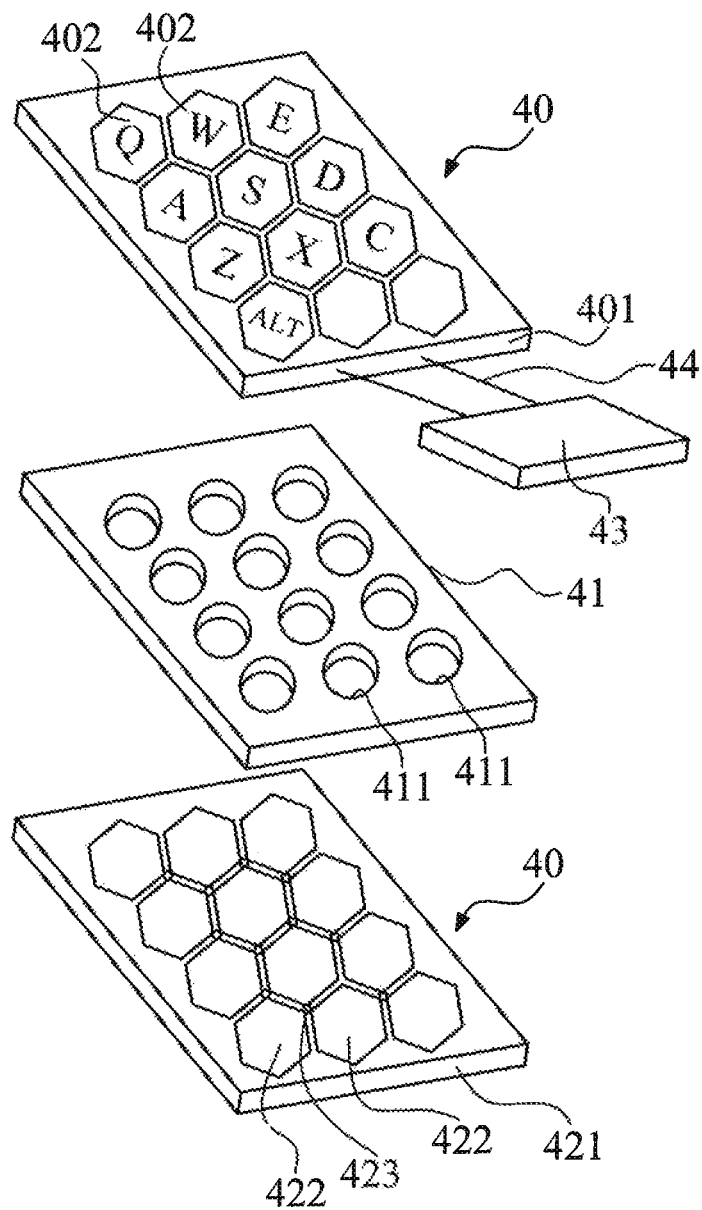
FIG. 14 is an exploded view of a capacitive touch keyboard according to a fifth embodiment of the present invention.
Figure 15:
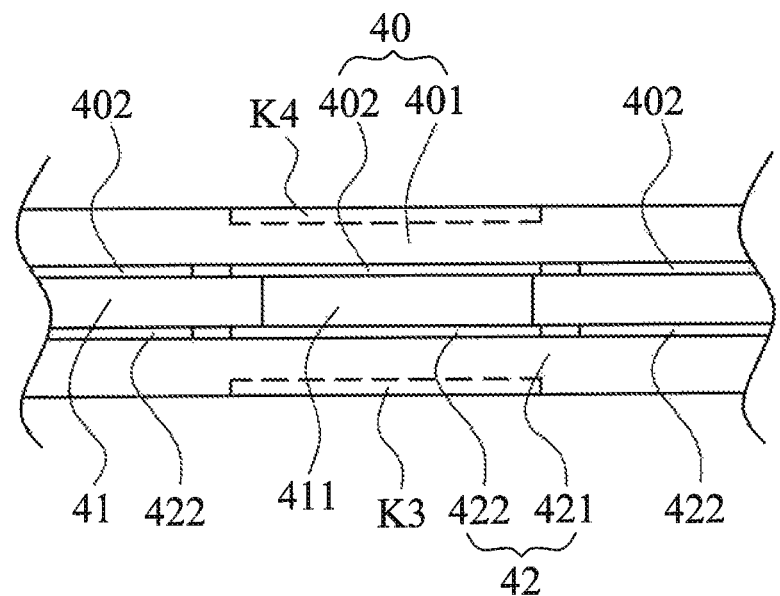
FIG. 15 is a cross sectional view of a capacitive touch keyboard according to a fifth embodiment of the present invention.

Referring FIG. 14, an exploded view of a capacitive touch keyboard according to a fifth embodiment of the present invention, and to FIG. 15, a cross sectional view of a capacitive touch keyboard according to a fifth embodiment of the present invention; in this embodiment a keyboard includes, a shielding layer 42, an intermediate layer 41, and a one-dimensional sensor layer 40, stacked from bottom to top, where the shielding layer 42 is disposed at top of the keyboard while the one-dimensional sensor layer 40 at bottom of the keyboard. Manufacturing of such keyboard configuration is particularly compatible with that of conventional membrane keyboards. That is, only by re-defining the pattern of conductors, the manufacturing procedure for conventional membrane keyboards can be used to accomplish the present invention.

In this example, the shielding layer 42, the intermediate layer 41, and the one-dimensional sensor layer 40 is implemented by soft material, though it does not constitute a limitation to the present invention.

The soft shielding layer 42 includes a dielectric material 421 and a conductive ground plane attached to the dielectric material. In this example the ground plane includes plural ground plane cells 422 with each cell 422 being shaped as hexagonal and that the adjacent ground plane cells 422 are electrically connected with each other through a connecting member 423 at apex.

The soft one-dimensional sensor layer 40 includes a substrate 40 and plural hexagonal sensing cells 402 formed on the substrate 40 where the sensing cells 402 correspond to the ground plane cells 422. Each of the sensing cells 402 individually electrically connect to the capacitance sensing circuit 43, for example, all conducting lines (not shown) from the sensing cells 402 are integrated in an FPC 44 which further connects to the capacitance sensing circuit 43.

The soft intermediate layer 41 includes plural through holes 411 corresponding to the sensing cells 402 and the ground plane cells 422 above. Due to separation by the intermediate layer 41, a coupling capacitance between the ground plane and the sensing cells 402 is generated, as described in the first embodiment.

The soft shielding layer 42, a its outer surface, defines plural first key areas K3, while the soft one-dimensional sensor layer 40, at its outer surface, defines plural second key areas K4. The through holes 411, the first and the second key areas K3 and K4 correspond to one another and thus when users depress any key area, a capacitance change happens, which will be probed by the sensing circuit 43.

It should be noted that a capacitance change will be produced either by depression operation or simply by touch a key. Besides, since user's deep depression also causes a voltage change, the capacitance sensing circuit 43 may further include a function of sensing the voltage change which occurs upon the two plates of the capacitance structure contacting each other by user's deep depression for identifying different operations. That is, the sensing circuit senses both an electronic parameter change correlating to the clearance between one of the sensing cells and the grounding conductive structure, and a capacity change resulting from a finger touch on the one-dimensional sensor layer. The electronic parameter change may be a capacitance change or a voltage change when the clearance between one of the sensing cells and the grounding conductive structure is substantially zero as the sensing cells and the grounding conductive structure contact each other.

The first key areas K3 and the second key areas K4 are not limited to be equal in number, and the sensing cells 402 may be configured to be more than the two key areas 3 and K4 for gesture operation. For example, the key area indicative of a space bar on the keyboard, which has larger dimension than other keys, may correspond to plural sensing cells 402 so that when a gesture is made across the space bar, the capacitance sensing circuit 43 can probe multiple capacitance changes for the corresponding cells 402.

With the soft shielding layer 42 disposed at bottom of the keyboard, when users place the keyboard on his legs, the ground plane effectively shields keyboard from the human body. In such condition, it is unfeasible to perform a gesture operation on the soft shielding layer 42 while a depression operation is allowed. However, the gesture operation on the soft shielding layer 42 becomes a choice provided that an opening is formed in the ground plane corresponding to the sensing cells 402, just as that described in the second embodiment.

In addition to depressing operation on either side of the keyboard, users are also allowed to perform a gesture operation at top of the keyboard at which the soft one-dimensional sensor layer is disposed.

Figure 16:
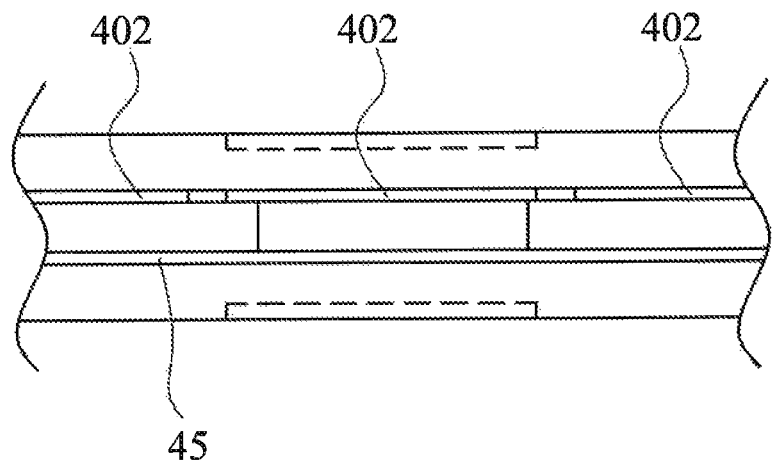
FIG. 16 is a cross sectional view of a capacitive touch keyboard according to a sixth embodiment of the present invention.

Referring to FIG. 16, a cross sectional view of a capacitive touch keyboard according to a sixth embodiment of the present invention; this embodiment is a modification of the fifth embodiment above, sharing similar structure to the fifth embodiment and has an exception that the ground plane 45 is in form of complete solid plate sheet with shielding effect. Such ground plane 45 may also be of a mesh pattern.

The foregoing description, for purposes of explanation, was set forth in specific details of the preferred embodiments to provide a thorough understanding of the invention. However, it will be apparent to one skilled in the art that specific details are not required in order to practice the invention.

Therefore, the foregoing descriptions of specific embodiments of the invention are presented for purposes of illustration and description only and should not be construed in any way to limit the scope of the invention. They are not intended to be exhaustive or to limit the invention to the precise forms disclosed; obviously, many modifications and variations are possible in view of the above teachings. The embodiments were chosen and described in order to best explain the principles of the invention and its practical applications, thereby enabling others skilled in the art to best utilize the invention and various embodiments with various modifications as are suited to the particular use contemplated. It is intended that the following Claims and their equivalents define the scope of the invention.

What is claimed is:

1. A capacitive touch keyboard, comprising:
   a shielding layer comprising a ground plane, wherein the shielding layer further comprises plural first key areas at an outer surface of the shielding layer;
   a one-dimensional sensor layer comprising plural sensing cells, wherein the one-dimensional sensor layer further comprises plural second key areas at an outer surface of the one-dimensional sensor layer, and the plural sensing cells correspond to the plural second key areas and the plural first key areas;
   an intermediate layer interposed between the ground plane of the shielding layer and the one-dimensional sensor layer so as to form a capacitor structure, wherein the shielding layer, the intermediate layer and the one-dimensional sensor layer are configured to have a clearance between the shielding layer and the one-dimensional sensor layer changeable in response to a pressing operation of a user on the plural first key areas or the plural second key areas; and
   a sensing circuit electrically connected to the plural sensing cells to probe a capacitance change.

2. The capacitive touch keyboard of claim 1, wherein the shielding layer further comprises a dielectric material covering on the ground plane.

3. The capacitive touch keyboard of claim 2, wherein the dielectric material is referred to PMMA, PET film, or rubber.

4. The capacitive touch keyboard of claim 1, wherein the ground plane is in form of plate sheet.

5. The capacitive touch keyboard of claim 1, wherein the ground plane comprises plural hexagonal ground plane cells and the adjacent ground plane cells are electrically connected with each other.

6. The capacitive touch keyboard of claim 1, wherein each of the plural sensing cells is surrounded by six other sensing cells so as to form a honeycomb pattern altogether.

7. The capacitive touch keyboard of claim 1, wherein the ground plane of the shielding layer is made of copper, silver paste, indium tin oxide, ATO, IZO, ZnO or the combination thereof.

8. The capacitive touch keyboard of claim 1, wherein the one-dimensional sensor layer is connected to the sensing circuit through an FPC.

9. The capacitive touch keyboard of claim 1, wherein the sensing circuit provides a stimulus voltage to the ground plane.

10. The capacitive touch keyboard of claim 1, wherein the intermediate layer comprises plural through holes and the first key areas and the second key areas are defined on the outer surface of the shielding layer and the outer surface of the one-dimensional sensor layer, respectively, at positions corresponding to different ends of the plural through holes.

11. A capacitive touch keyboard, comprising:
    a shielding layer comprising a grounding conductive structure;
    a one-dimensional sensor layer comprising a plurality of sensing cells, and having at least one key area on an outer surface of the one-dimensional sensor layer;
    an intermediate layer interposed between the shielding layer and the one-dimensional sensor layer so as to form a plurality of capacitor members, and having a through hole thereon corresponding to the key area, wherein the one-dimensional sensor layer deforms by way of a space of the through hole in response to a pressing operation on the key area, thereby changing a clearance between one of the sensing cells and the grounding conductive structure; and
    a sensing circuit electrically connected to the plurality of sensing cells for sensing both an electronic parameter change correlating to the clearance between one of the sensing cells and the grounding conductive structure, and a capacitance change resulting from a finger touch on the one-dimensional sensor layer.

12. The capacitive touch keyboard of claim 11, wherein the electronic parameter change is a capacitance change.

13. The capacitive touch keyboard of claim 11, wherein the electronic parameter change is a voltage change when the clearance between one of the sensing cells and the grounding conductive structure is substantially zero as one of the sensing cells and the grounding conductive structure contact each other.

14. The capacitive touch keyboard of claim 11, wherein the shielding layer further comprises a dielectric material covering on the grounding conductive structure.

15. The capacitive touch keyboard of claim 14, wherein the dielectric material is referred to PMMA, PET film, or rubber.

16. The capacitive touch keyboard of claim 11, wherein the grounding conductive structure is provided with openings at positions corresponding to the sensing cells.

17. The capacitive touch keyboard of claim 11, wherein each of the plural sensing cells is surrounded by six other sensing cells so as to form a honeycomb pattern altogether.

18. The capacitive touch keyboard of claim 11, wherein the grounding conductive structure of the shielding layer is made of copper, silver paste, indium tin oxide, ATO, IZO, ZnO or the combination thereof.

19. The capacitive touch keyboard of claim 11, wherein the one-dimensional sensor layer is connected to the sensing circuit through an FPC.

20. The capacitive touch keyboard of claim 11, wherein the sensing circuit provides a stimulus voltage to the grounding conductive structure.

* * * * *